(12) United States Patent
Ranganathan et al.

(10) Patent No.: US 10,908,635 B1
(45) Date of Patent: Feb. 2, 2021

(54) DETECTION AND MANAGEMENT OF FREQUENCY ERRORS IN A REFERENCE INPUT CLOCK SIGNAL

(71) Applicant: Silicon Laboratories Inc., Austin, TX (US)

(72) Inventors: Harihara Subramanian Ranganathan, Round Rock, TX (US); Vivek Sarda, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/726,481

(22) Filed: Dec. 24, 2019

(51) Int. Cl.
| | |
|---|---|
| G06F 1/06 | (2006.01) |
| H03L 7/099 | (2006.01) |
| H03L 7/085 | (2006.01) |
| H03L 7/197 | (2006.01) |
| H03L 7/089 | (2006.01) |

(52) U.S. Cl.
CPC ............... *G06F 1/06* (2013.01); *H03L 7/085* (2013.01); *H03L 7/0891* (2013.01); *H03L 7/099* (2013.01); *H03L 7/1974* (2013.01)

(58) Field of Classification Search
CPC . H03L 7/06; H03L 7/146; H03L 7/235; H03L 7/1974; H03L 7/0891; H03L 7/099
USPC ........ 331/2, 18, 46, 1 R; 327/156, 158, 159, 327/149
See application file for complete search history.

(56) References Cited

U.S. PATENT DOCUMENTS

| | | | |
|---|---|---|---|
| 5,572,167 A | 11/1996 | Odder | |
| 6,429,693 B1 | 8/2002 | Staszewski | |
| 6,570,454 B2 | 5/2003 | Skierszkan | |
| 7,148,753 B1 | 12/2006 | Garlepp | |
| 7,508,274 B2 | 3/2009 | Keating | |
| 7,579,887 B1 | 8/2009 | Friedman | |
| 8,248,106 B1 | 8/2012 | Cohen | |
| 8,362,815 B2 | 1/2013 | Pavlovic | |
| 8,396,085 B2 | 3/2013 | Jin | |
| 8,599,986 B2 | 12/2013 | Rahbar | |
| 8,686,771 B2 | 4/2014 | Frantzeskakis | |
| 8,786,341 B1 | 7/2014 | Weltin-Wu et al. | |
| 8,791,734 B1 | 7/2014 | Hara et al. | |
| 9,379,880 B1 | 6/2016 | Xu | |
| 9,484,938 B2 | 11/2016 | Vandepas | |
| 9,634,861 B2 | 4/2017 | Caffee | |
| 9,660,797 B2 | 5/2017 | Zhu | |

(Continued)

OTHER PUBLICATIONS

Analog Devices, Inc. "Dual PLL, Asynchronous Clock Generator," Data Sheet AD9576, 2016-2018, downloaded rom www.analog.com, Dec. 9, 2019, 65 pages.

*Primary Examiner* — Arnold M Kinkead (74) *Attorney, Agent, or Firm* — Zagorin Cave LLP (57) ABSTRACT

A method for generating a clock signal includes selecting a primary reference clock signal or a secondary reference clock signal as a reference clock signal for a phase-locked loop configured to generate an output clock signal. The method includes generating an indication of whether a failure of the reference clock signal has occurred by monitoring the secondary reference clock signal and a plurality of additional clock signals using the reference clock signal. The failure is determined based on whether a gross failure of the reference clock signal has occurred and if the gross failure has not occurred, further based on whether a quality failure of the reference clock signal has occurred.

20 Claims, 5 Drawing Sheets

(56) References Cited

U.S. PATENT DOCUMENTS

| | | |
|---|---|---|
| 9,705,668 B2 | 7/2017 | Huang |
| 10,057,051 B2 | 8/2018 | Huang |
| 10,063,245 B2 | 8/2018 | Hashimoto |
| 10,320,509 B2 | 6/2019 | Huang et al. |
| 10,340,927 B1 | 7/2019 | Gambhir |
| 10,355,699 B2 | 7/2019 | Spijker |
| 10,483,987 B1 * | 11/2019 | Ranganathan .......... H03L 7/085 |
| 2002/0070811 A1 | 6/2002 | Skierszkan |
| 2006/0171496 A1 | 8/2006 | Nakamuta |
| 2008/0191762 A1 | 8/2008 | Seethamraju |
| 2008/0204092 A1 | 8/2008 | Moehlmann |
| 2009/0256601 A1 | 10/2009 | Zhang |
| 2011/0007859 A1 | 1/2011 | Ueda |
| 2011/0032013 A1 | 2/2011 | Nelson |
| 2012/0013406 A1 | 1/2012 | Zhu et al. |
| 2014/0306689 A1 | 10/2014 | Lavery |
| 2015/0145567 A1 | 5/2015 | Perrott |
| 2015/0222280 A1 * | 8/2015 | Allan ..................... H03L 7/083 |
| | | 327/157 |
| 2016/0079991 A1 | 3/2016 | Pelissier |
| 2017/0187481 A1 * | 6/2017 | Huang .................. H04J 3/0688 |
| 2019/0007055 A1 | 1/2019 | Nelson |
| 2019/0384351 A1 * | 12/2019 | J ........................... H03L 7/1976 |

\* cited by examiner

DETECTION AND MANAGEMENT OF FREQUENCY ERRORS IN A REFERENCE INPUT CLOCK SIGNAL

BACKGROUND

Field of the Invention

This disclosure relates to electronic devices and more particularly to clock signals for electronic devices.

Description of the Related Art

An exemplary application (e.g., communications networking) requires clock signals with accurate and stable frequency and phase for proper operation. For example, a typical line card provides an interface for supporting communication between a service and the rest of the network. The line card may provide frequency synthesis and jitter attenuation based on a received standard-accurate clock signal (e.g., a Network Time Protocol time source for stratum 2 or stratum 3 synchronization) or from other external clock source (e.g., crystal oscillators) to generate one or more local clock signals having high frequency accuracy. Line cards compliant with standards such as Ethernet, Synchronous Optical Network (SONET), Synchronous Digital Hierarchy (SDH), or Synchronous Ethernet utilize clock generation circuits to generate local clock signals used in data transmission and reception and other applications.

Rather than use individual frequency control devices for many of the subsystems, a single frequency-controlled source that uses a reference clock signal (e.g., a clock signal generated using a crystal) receives input clock signals and generates output clock signals based on the received input clock signals. In general, crystal clock sources are low-cost components that provide low-jitter performance, and are typically used to generate reference clock signals for timing products. However, long-term stability and accuracy is limited by aging of the crystal. Loss of the reference clock signal (i.e., loss-of-signal (LOS) condition) or a sudden change in frequency of the reference clock signal (i.e., out-of-frequency (OOF) condition) as a result of crystal aging, may cause catastrophic system failure from which it is difficult or impossible for a system to recover or even diagnose. Accordingly, improved techniques for managing clock signals are desired.

SUMMARY OF EMBODIMENTS OF THE INVENTION

In at least one embodiment, a method for generating a clock signal includes selecting a primary reference clock signal or a secondary reference clock signal as a reference clock signal for a phase-locked loop configured to generate an output clock signal. The method includes generating an indication of whether a failure of the reference clock signal has occurred by monitoring the secondary reference clock signal and a plurality of additional clock signals using the reference clock signal. The failure is determined based on whether a gross failure of the reference clock signal has occurred and if the gross failure has not occurred, further based on whether a quality failure of the reference clock signal has occurred.

In at least one embodiment, a clock product includes a phase-locked loop configured to generate an output clock signal based on a reference clock signal and an input clock signal. The reference clock signal is selected from a primary reference clock signal and a secondary reference clock signal. A control circuit is configured to generate an indication of whether a failure of the reference clock signal has occurred by monitoring the secondary reference clock signal and a plurality of additional clock signals using the reference clock signal. The failure is determined based on whether a gross failure of the reference clock signal has occurred and if the gross failure has not occurred, further based on whether a quality failure of the reference clock signal has occurred.

An integrated circuit product includes a clock buffer integrated circuit configured to generate an output clock signal based on a reference clock signal and a frequency reference signal. The reference clock signal is selected from a primary reference clock signal and a secondary reference clock signal. The integrated circuit product includes a controller integrated circuit configured to receive from the clock buffer integrated circuit, a first indicator of whether a gross failure of the reference clock signal has occurred. The controller integrated circuit is configured to generate a second indicator of whether a quality failure of the reference clock signal has occurred based on the primary reference clock signal, the secondary reference clock signal, the frequency reference signal, and an additional reference clock signal. The integrated circuit product generates a status signal indicating a failure of the reference clock signal based on the first indicator and the second indicator.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

An exemplary clock product combines gross failure detection with statistical analysis techniques to detect errors in a clock signal used as a reference for a phase-locked loop of the clock product. In response to detecting an error, the clock product takes a predetermined action (e.g., switches the signal provided as the reference clock signal to the phase-locked loop, reconfigures the phase-locked loop to operate open loop, disables one or more output clock signal, generates a status signal, or performs a combination thereof). The clock product detects gross failures (e.g., absence of a clock signal or frequency errors in the thousands of parts-per-million (ppm)) relatively quickly (e.g., in nanoseconds). The clock product also detects quality failures (e.g., frequency errors in the tens of ppm) using statistical analysis, which requires additional time (e.g., milliseconds) than detection of gross errors.

Figure 1:
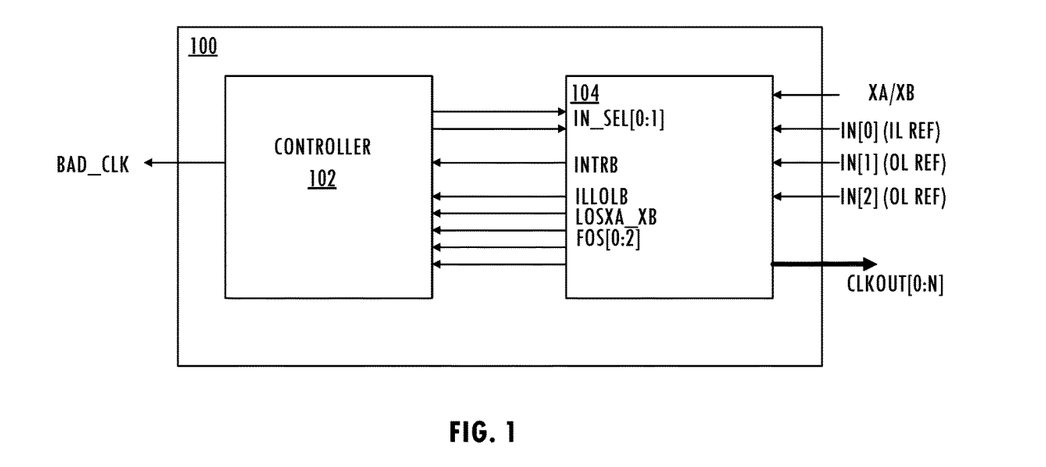
FIG. 1 illustrates a functional block diagram of a clock product.

Referring to FIG. 1, in at least one embodiment, clock product 100 receives various clock signals and uses one of those clock signals as a reference clock signal (e.g., clock signal XA/XB generated by a crystal) to sense the other clock signals (e.g., input clock signals IN[0:2]). Those clock signals have varying levels of jitter, stability, and reliability that are compared in the table below:

| clock source | type | clock jitter | clock stability | likelihood of clock failure |
|---|---|---|---|---|
| reference oscillator crystal (XA/XB) | internal | okay | bad | 1 |
| | input | excellent | okay | 4 |
| crystal oscillator input (IN[0]) | input | good | good | 3 |
| TCX0/OCX0 (IN[2]) | input | okay | very good | 2 |
| network source (IN[1]) | input | bad | excellent | 5 |

In at least one embodiment, clock product 100 includes controller 102 and clock buffer 104, which monitors at least one received clock signal (e.g., input clock signals IN[0:2]) using reference clock signal XA/XB (e.g., generated using a local, external crystal coupled to the XA/XB input terminal). Input clock signal IN[0] is generated by a secondary oscillator that has low jitter and is used as a backup reference clock signal if the crystal oscillator fails. Input clock signal IN[1] and input clock signal IN[2] are known stable frequency reference signals generated based on an atomic clock reference (e.g., SyncE, GPS, SONET, or PTP timestamps) or a local temperature-controlled crystal oscillator (TCXO). Although input clock signals IN[1] and IN[2] are stable frequency references, they are characterized by high jitter and are not suitable as a reference clock signal for some applications. In at least one embodiment, input clock signals IN[0:2] are generated using two local oscillators and a network clock source, but in other embodiments, three local oscillators are used, where one local oscillator is a crystal oscillator having low jitter, medium stability (e.g., +/−10 ppm) and the other two oscillators are temperature controlled crystal oscillators.

Clock product 100 provides at least one output clock signal CLKOUT[0:N] and at least one status signal (e.g., output signal BAD_CLK). In at least one embodiment, controller 102 provides configuration information to clock buffer 104 via IN_SEL[0:1] or other control interface. Clock buffer 104 provides clock indicator signals (e.g., LOSXA_XB, ILLOLB, INTRB, and FOS[0:2]) to controller 102, which outputs one or more status signals (e.g., output signal BAD_CLK) based on the clock indicator signals. The status signal indicates to a user that even if clock product 100 generates output clock signal CLKOUT[n], the frequency of CLKOUT[n] is unreliable. Controller 102 and clock buffer 104 are configured to detect gross failures of the reference clock signal and also to detect more subtle quality failures. In at least one embodiment, controller 102 and clock buffer 104 are separate integrated circuit die packaged in a multi-chip module to form clock product 100. However, in other embodiments, the functions of controller 102 and clock buffer 104 are implemented by a single integrated circuit die.

Figure 2:
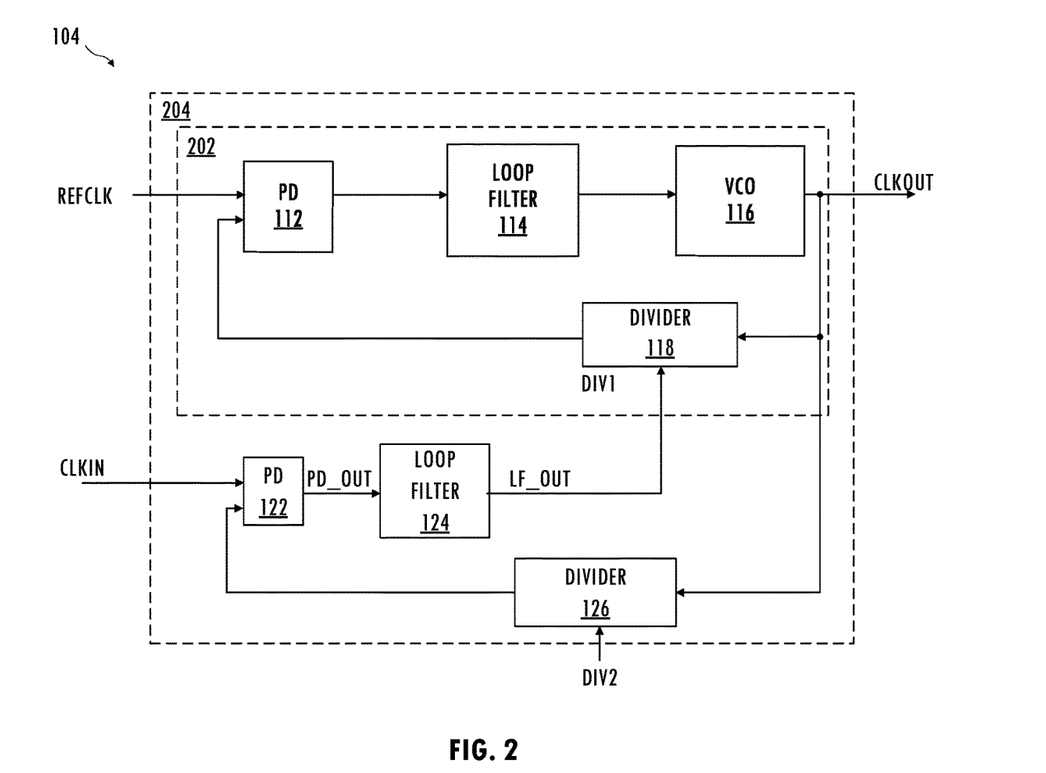
FIG. 2 illustrates a functional block diagram of an exemplary cascaded phase-locked loop clock generation circuit including an inner loop and an outer loop.

Referring to FIG. 2, in at least one embodiment, clock buffer 104 includes a multi-loop phase-locked loop that generates output clock signal CLKOUT having low jitter, by locking input clock signal CLKIN to reference clock signal REFCLK. Inner phase-locked loop 202, is a first phase-locked loop that includes phase/frequency detector 112, loop filter 114, voltage-controlled oscillator 116, and divider 118. Voltage controlled oscillator 116 may be implemented as a ring oscillator, an LC oscillator, or other suitable oscillator structure. Phase/frequency detector 112 receives reference clock signal REFCLK based on a signal provided by a reference clock source, which includes a fixed source such as a crystal (described above), or other suitable low-jitter source.

Outer phase-locked loop 204 is another phase-locked loop that includes phase/frequency detector 122, loop filter 124, and divider 126, and uses inner phase-locked loop 202 as a digitally controlled oscillator responsive to digital divider ratio DIV1, which may be a fractional divider value, provided by loop filter 124. Phase/frequency detector 122 receives input clock signal CLKIN based on a signal selected from input clock signals IN[0:2] and a feedback signal, which may be a frequency-divided version of output clock signal CLKOUT. Phase/frequency detector 122 provides a phase error signal reflecting the difference between input clock signal CLKIN and the feedback signal.

The frequency of output clock signal CLKOUT is determined by the frequency of reference clock signal REFCLK and the divider ratio DIV1 generated by outer phase-locked loop 204 and provided to divider 118 in the feedback path of inner phase-locked loop 202. Outer phase-locked loop 204 adjusts divider ratio DIV1 to match the frequency of output clock signal CLKOUT to the frequency of input clock signal CLKIN or to a multiple (implemented using divider ratio DIV2) of the frequency of input clock signal CLKIN (e.g., CLKIN=CLKOUT/DIV2). In at least one embodiment of clock buffer 104, one or more output frequency dividers (not shown) may be included to generate output clock signals CLKOUT[0:N] based on output clock signal CLKOUT.

Figure 3:
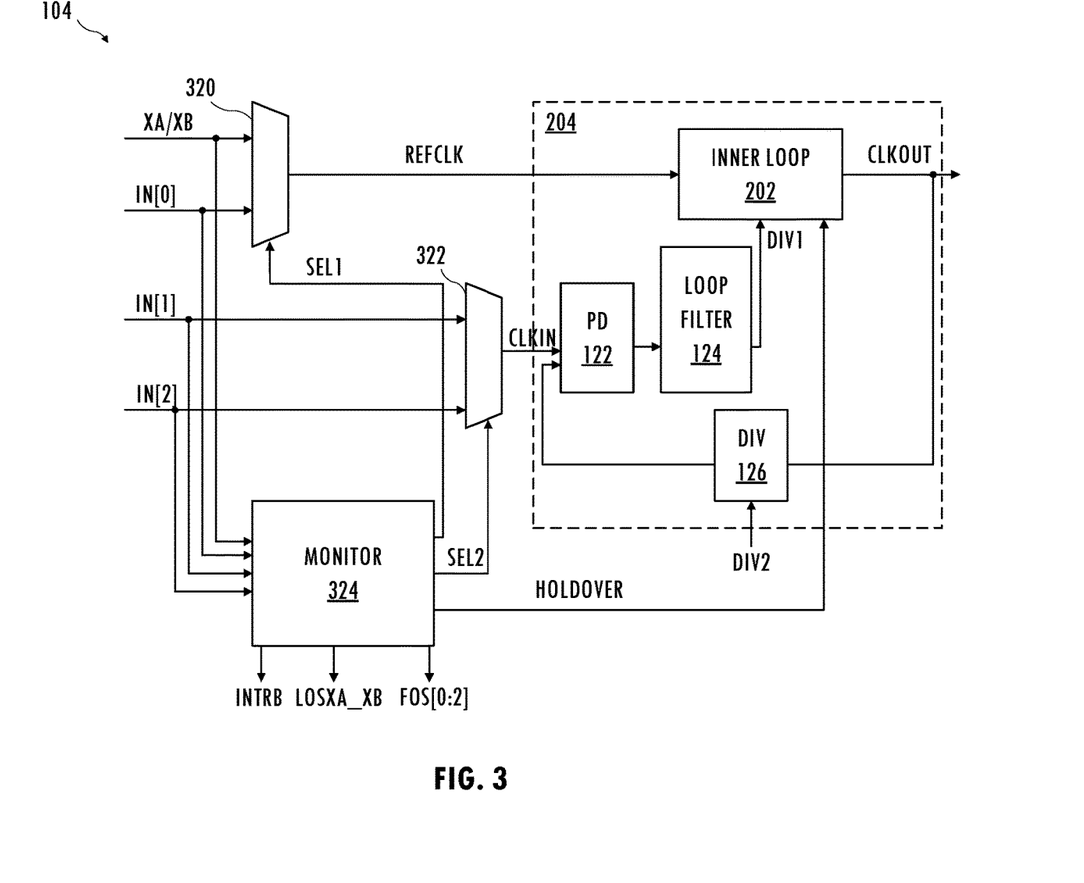
FIG. 3 illustrates a functional block diagram of an exemplary clock buffer circuit consistent with at least one embodiment of the invention.
Figure 4:
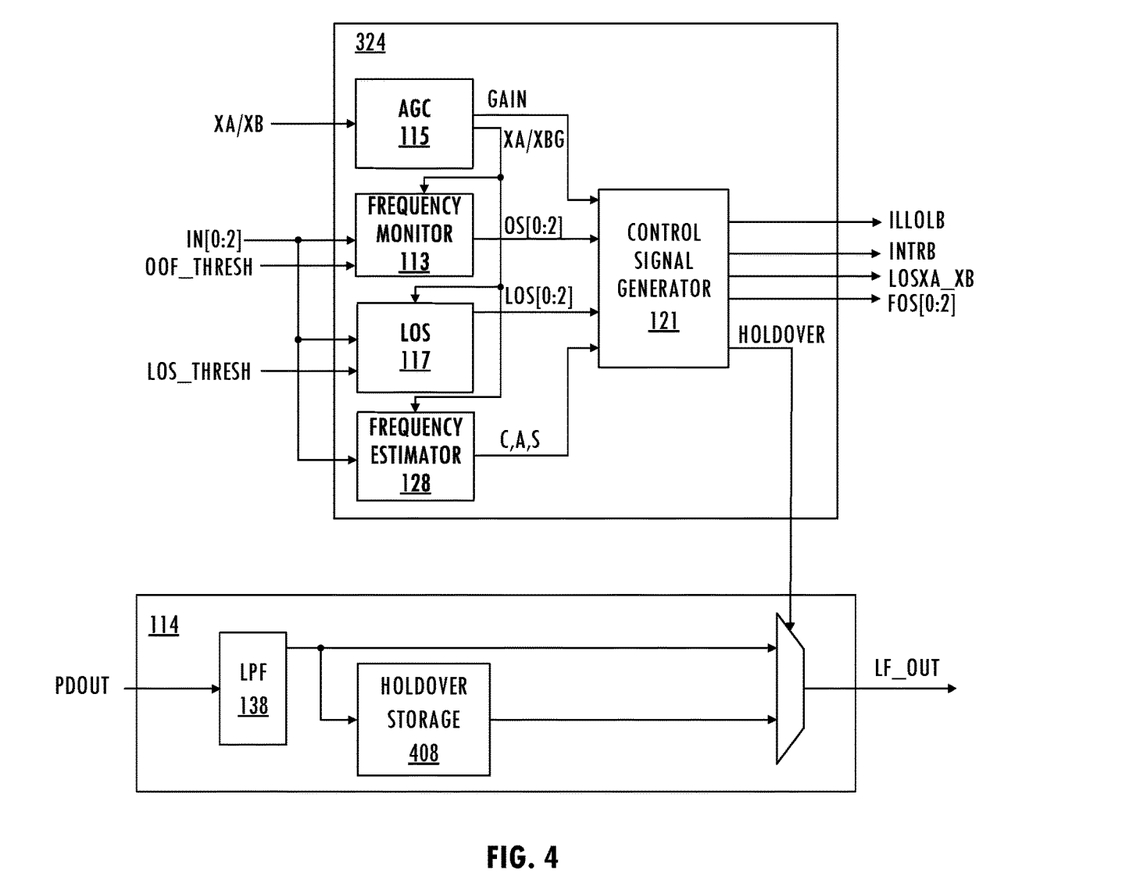
FIG. 4 illustrates a functional block diagram of portions of the exemplary clock buffer of FIGS. 2 and 3 consistent with at least one embodiment of the invention.

Referring to FIGS. 2, 3, and 4, in at least one embodiment, clock buffer 104 includes monitor 324, which detects clock signal events and generates control signals and indicators associated with those clock signal events. In at least one embodiment of clock generator 104, monitor 324 monitors input clock signals IN[0:2] using reference clock signal XA/XB, detects gross failures of the input clock signals (e.g., out-of-frequency (OOF) events and loss-of-signal (LOS) events), and generates associated control signals, e.g., control signals SEL1, SEL2, and HOLDOVER, that configure select circuit 320 to provide a selected clock signal as reference clock signal REFCLK, configure select circuit 322 to provide a selected clock signal as input clock signal CLKIN, and enable a holdover mode, respectively. Monitor 324 uses clock signal XA/XB as reference clock signal RECLK to monitor a plurality of independent and randomly varying clock sources (e.g. input clock signals IN[0:2]).

In at least one embodiment of clock product 100, input clock signals IN[1] and IN[2] have much better frequency stability than reference clock signal XA/XB. Input clock signal IN[0] is a backup clock source for clock signal XA/XB. Monitor 324 estimates frequency errors in input clock signals IN[0:2]. The statistics collected from the frequency data of each input clock signal are used in various ways. If only one of the input clock signals IN[0:2] has a frequency offset that is outside a target statistical range, that input clock signal is flagged as failing (e.g., clock indicator signal FOS[n] is set). If all of input clock signals IN[0:2]

have the same frequency offset, then reference clock signal REFCLK is failing. If clock signal XA/XB was previously established as failing and a backup clock signal (e.g., input clock signal IN[0]) was switched to be reference clock signal REFCLK, and if the remaining input clock signals IN[1:2] have the same frequency offset, the backup clock signal is failing and the output clock signal CLKOUT output is flagged as failing.

In at least one embodiment, monitor 324 uses signals generated by automatic gain control circuit 115 to detect failure of a crystal due to aging. In general, a crystal generates a signal with reduced amplitude prior to complete failure. In at least one embodiment, automatic gain control circuit 115 generates a parameter GAIN to amplify clock signal XA/XB to a target signal level usable by clock buffer 104. Control signal generator 121 compares automatic gain control parameter GAIN to a threshold value to detect a loss of amplitude in clock signal XA/XB indicative of the crystal failing and generates a clock indicator signal based thereon.

Frequency monitor 113 generates an indication of gross failure according to whether the input clock signals IN[0:2] have a frequency in a target range based on comparisons made using reference clock signal XA/XB and based on a predetermined frequency offset threshold OOF_THRESH (e.g., 300 part-per-million per second (ppm/s)). In at least one embodiment, frequency monitor 113 performs a frequency-to-digital conversion of input clock signals IN[0:2] using the reference clock signal. A relative frequency measurement circuit, which may include a frequency counter circuit, generates a digital frequency ratio of the frequency of input clock signal IN[n] to frequency of the reference clock signal CLKREF. That digital frequency ratio is compared to a predetermined value to determine corresponding frequency offsets OS[0:2]. In at least one embodiment, frequency monitor 113 measures the clock period of input clock signals IN[0:2] in the background (e.g., using a time-to-digital converter controlled using reference clock signal REFCLK and a comparator) and provides frequency offset values OS[0:2] for input clock signals IN[0:2], respectively. Control signal generator 121 compares the frequency offset values OS[0:2] to a threshold value and generates corresponding frequency offset indicators FOS[0:2] indicating whether the input signal has a gross frequency offset. If the frequency offsets OS[0:2] associated with input clock signals IN[0:2] are greater than predetermined frequency difference threshold OOF_THRESH (e.g., OS[n]>OFF_THRESH), then control signal generator 121 indicates detection of an out-of-frequency event for the corresponding clock signal (e.g., sets a corresponding bit of FOS[0:2]).

Under some circumstances, input clock signals IN[0:2] are within a target frequency range (i.e., frequency monitor 113 does not detect an out-of-frequency event for any of input clock signals IN[0:2]), but reference clock signal REFCLK experiences a disruption. Control signal generator 121 determines whether reference clock signals REFCLK is lost based on the frequency offset of each of the monitored input clock signals. For example, if each of the monitored input clock signals drifts by the same frequency offset, control signal generator 121 determines that the frequency of reference clock signal REFCLK has drifted substantially, and generates an indication that the input reference clock signal REFCLK has failed (i.e., sets output ILLOLB). Control signal generator 121 signals the event by interrupting controller 102 (i.e., sets INTRB).

Loss-of-signal detector 117 determines whether each of input clock signals IN[0:2] is present or lost (i.e., a loss-of-signal condition is detected) and generates a corresponding gross failure indicator (e.g., LOS[0:2]). If all three of the input clock signals are lost, control signal generator 121 infers that clock signal XA/XB is lost and generates a corresponding indicator signal (e.g., a corresponding value of LOSXA_XB is cleared and a corresponding value of ILLOLB is cleared).

In addition, clock product 100 estimates the quality of the reference clock signal REFCLK using input clock signals IN[0:2] sensed using the reference clock signal. Frequency estimator 128 stores frequency information and uses the history of frequency information (e.g., long term frequency averages) to detect frequency changes (e.g., changes in short-term frequency averages). The statistics are compared to a threshold to generate status signals that may be used by the system to react according to predetermined actions. This technique allows the system to react to subtle frequency changes (e.g., 10 ppm).

In at least one embodiment, frequency estimator 128 includes one or more counters controlled by the sensor clock signal to generate time stamps for each sensed clock signal. Those time stamps may be stored in buffers corresponding to each sensed clock signal and provided to frequency estimator 128. Frequency estimator 128 determines and stores statistics that are used to estimate the state or quality of the reference clock signal and each of the input clock signals sensed using the reference clock signal. The sampling rate (i.e., the rate at which the clock product collects these statistics), the measurement window (i.e., the time to measure each sample of a statistic), and the initial startup time (i.e., the minimum amount of time required for statistics to be valid after every state transition defined by a number of measurement samples) determines the speed of response of the clock product to clock quality changes and precision of clock quality measurements. The sampling rate and measurement window vary with implementation details.

If frequency estimator 128 provides one frequency measurement every $t_m$ seconds for each of r clock signals, and frequency estimator 128 processes frequency measurements for each of r clock signals in series, then $r \times t_m$ is the window size and control signal generator 121 can make a decision at a rate of $r \times t_m$ seconds under steady-state operations. The measurement time should be short enough that the resulting statistics are correlated to the reference clock signal. If $t_m$ is too long, then the statistics are not sufficiently correlated to the reference clock signal. For example, if an application requires a decision once per millisecond, then the window size should be sufficiently smaller than 1 millisecond to guarantee computation of the statistics for r clock signals during a 1 millisecond window. In such embodiments, only frequency transients with a time constant of 1 millisecond or larger can be tracked. A target window size can be achieved by adjusting r or $t_m$ and the fastest update rate for decision-making is $1/(r \times t_m)$.

In at least one embodiment, frequency estimator 128 processes frequency measurements for each of r clock signals in parallel. The frequency of each clock signal is measured in a window of $t_m$ seconds. Window $t_m$ is set by the period of the slowest clock signal and the sampling rate is set by the fastest clock signal. In at least one embodiment, the frequency estimation technique sets window $t_{mi}$, where $0<i<r$ for r clock signals, to be a function of the time period of the $i^{th}$ clock signal. Ideally, window $t_{mi}$ equals one clock period of the $i^{th}$ clock signal. In at least one embodiment, the frequency estimation technique sets the sampling rate to be ten times the maximum window $t_{mi}$.

The number of measurement samples collected for each estimate determines the precision of the estimate. If frequency estimator 128 collects N frequency samples, then a multiplication factor for the number of standard deviations between the average frequency count and the nearest specification limit (i.e., sigma) of the statistics is defined by N. For example, if control signal generator 121 is to make a decision between +/−3 sigma for a clock signal, then frequency estimator 128 needs to collect 1000 continuous samples for the clock signal. Thus, as N increases, precision increases, but the startup time also increases. In at least one embodiment, threshold levels used by clock product 100 are determined based on specifications for each source and the associated failure and reliability data and the target application.

Figure 5:
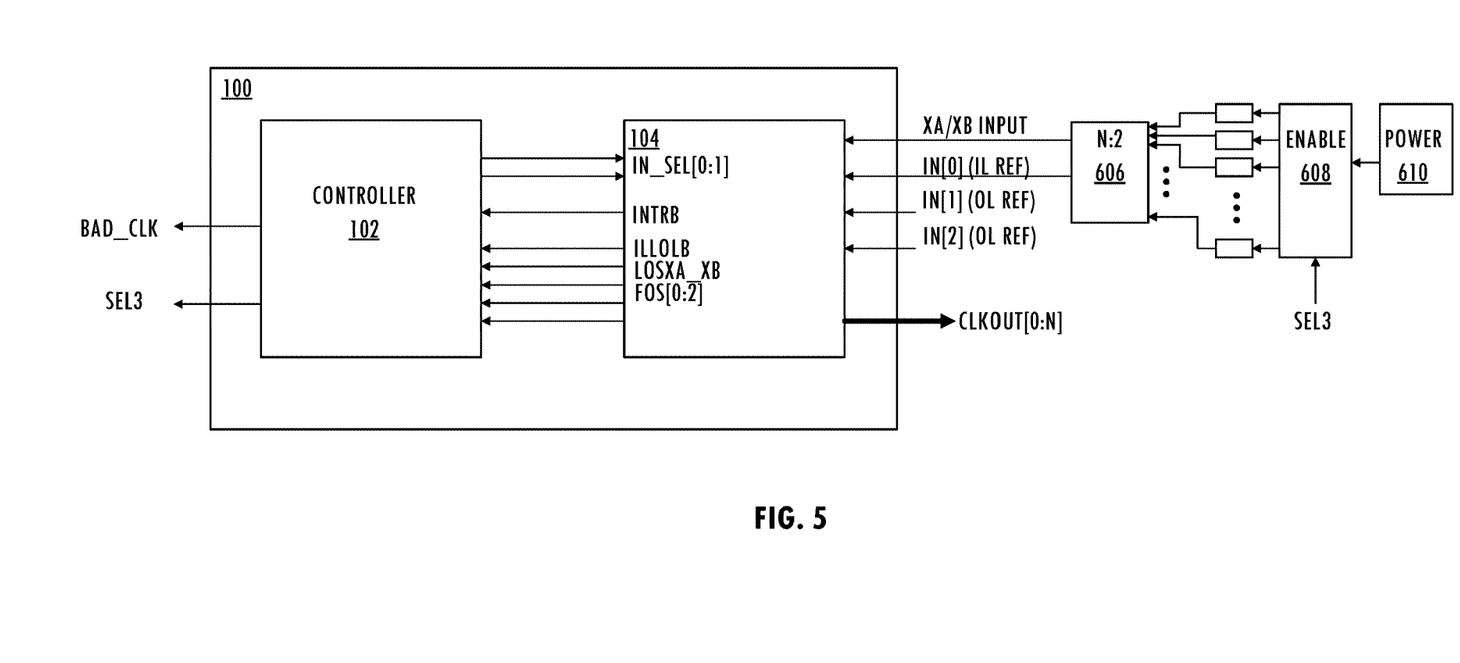
FIG. 5 illustrates a functional block diagram of a clock product in an exemplary application consistent with at least one embodiment of the invention.

Referring to FIGS. 4 and 5, in at least one embodiment of clock product 100, monitor 324, which in at least one embodiment is implemented by a microcontroller unit of clock product 100, determines quality of the reference clock signal using estimates of current frequency count (C), average frequency count (A), and the variation of the last n frequency counts (S) for each of input clock signals IN[0:2]. Frequency estimator 128 uses those estimates to determine a positive frequency deviation ($E_p$), a negative frequency deviation ($E_n$), and an average frequency deviation (P) for each input clock signal:

$$E_{IN0p}=C_{IN0}-(A_{IN0}+x\times S_{IN0})\ E_{IN1p}=C_{IN1}-(A_{IN1}+x\times S_{IN1})$$
$$E_{IN2p}=C_{IN2}-(A_{IN2}+x\times S_{IN2})$$

$$E_{IN0n}=C_{IN0}-(A_{IN0}-x\times S_{IN0})\ E_{IN1n}=C_{IN1}-(A_{IN1}-x\times S_{IN1})\ E_{IN2n}=C_{IN2}-(A_{IN2}-x\times S_{IN2})$$

$$P_{IN0}=(E_{IN0p}+E_{IN0n})/2\times A_{IN0}\ P_{IN1}=(E_{IN1p}+E_{IN1n})/2\times A_{IN1}\ P_{IN2}=(E_{IN2p}+E_{IN2n})/2\times A_{IN2}.$$

In at least one embodiment, clock product 100 uses the positive frequency deviation ($E_p$), negative frequency deviation ($E_n$), and average frequency deviation (P) for each input clock signal IN[0:2] to determine whether the reference clock signal has failed.

If frequency estimator 128 takes one measurement every $t_m$ seconds for each of three sources in serial, then frequency estimator can make a decision at a rate of every $3\times t_m$ seconds in steady-state operation. Thus, the fastest update rate for decision-making is $1/(3\times t_m)$. In an exemplary embodiment, $t_m$ is approximately 100 µs. Multiplicative factor x for S is a function of N, where N is the number of samples collected. For frequency estimator to make a decision between +/−3 sigma, frequency estimator 128 must collect 1000 continuous samples. This impacts start-up time (i.e., the minimum time required for statistics to be valid after each source transition but provides improved precision in sensing frequency errors.

If no loss-of-signal is detected for input clock signals IN[0:2] and if positive frequency deviation $E_{IN1p}$ is greater than zero or negative frequency deviation $E_{IN1n}$ is less than zero (i.e., if ($E_{IN1p}>0\|E_{IN1n}<0$)) or if the average frequency deviation is equal for input clock signals [0:2] and exceeds a predetermined average frequency deviation $P_{SET}$, (i.e., $P_{IN0}=P_{IN1}=P_{IN2}>P_{SET}$), then control signal generator 121 determines that the reference clock signal is bad, clock buffer 104 sets an indicator accordingly (e.g., ILLOLB=0 or INTRB=0), and controller 102 sets a status signal accordingly (e.g., BAD_CLK=1). Clock product 100 takes a predetermined action (e.g., initiates a switch of the reference clock signal REFCLK from a primary reference clock signal XA/XB to a secondary reference clock signal IN[0]), accordingly.

If a loss-of-signal is detected for the input clock signal provided to the outer loop of the phase-locked loop (e.g., input clock signal IN[1]), but no loss of signal is detected for the other two input clock signals IN[0] or IN[2], and if positive frequency deviation $E_{IN2p}$ is greater than zero or negative frequency deviation $E_{IN2n}$ is less than zero (i.e., if ($E_{IN2p}>0\|E_{IN2n}<0$)) or the average frequency deviation of clock signal IN[0] equals the average frequency deviation of clock signal IN[2], and exceeds a predetermined average frequency deviation $P_{SET}$ (i.e., $P_{IN0}=P_{IN2}>P_{SET}$), then control signal generator 121 determines that the reference clock signal REFCLK is bad and takes a predetermined action (e.g., initiates a switch of the reference clock signal REFCLK from clock signal XA/XB to a secondary reference clock signal, clock signal IN[0]), accordingly. If control signal generator 121 detects a loss of signal for both input clock signals IN[1] and IN[2] (e.g., the input to outer loop of the phase-locked loop), but the reference clock signal CLKREF has no loss of signal (e.g., clock signal XA/XB has not failed), then the inner loop of the phase-locked loop remains locked to clock signal XA/XB.

Referring to FIG. 1, in at least one embodiment, controller 102 receives an interrupt from clock buffer 104 (e.g., via INTRB) and uses information provided by clock buffer 104 (e.g., indicators ILLOLB, LOSXA_XB, FOS[0:2]) and acts according to predetermined user preferences. For example, if the input reference clock signal REFCLK has failed (e.g., LOSXA_XB or ILLOLB are set), controller 102 changes control signal INSEL[0:1] to '00' from '11' to switch the active reference clock signal of the phase-locked loop from clock signal XA/XB to a secondary reference clock signal (e.g., input clock signal IN[0]). In at least one embodiment, that switch is made automatically by clock buffer 104 in response to LOSXA_XB being set. However, in at least one embodiment, clock buffer 104 or controller 102 does not switch the reference clock signal in response to a failure indicator being set. Instead, clock buffer 104 continues to provide an output clock signal based on an input reference clock signal that has a frequency error and sets a status signal indicative of the failure. In response to detecting an out-of-frequency event for input clock signal CLKIN, clock buffer 104 or controller 102 triggers either a clock switch to another clock signal (e.g., changes control signal SEL2 to select input clock signals IN[2] from input clock signal IN[1] or triggers holdover mode and may return to the currently selected active clock signal after a predetermined time has elapsed.

Referring to FIGS. 2, 3, and 4, in an embodiment of clock buffer 104, if monitor 324 detects that reference clock signal REFCLK (e.g., clock signal XA/XB) has a gross failure or a quality failure, inner loop 202 freezes loop filter 114 such that output clock signal CLKOUT no longer tracks changes to reference clock signal REFCLK, and selects a held output of low pass filter 138 stored in storage 408, or a value based on the stored output of low pass filter 138, to be provided to voltage-controlled oscillator 116, thereby holding steady the phase of output clock signal CLKOUT. For example, monitor 324 holds the output of loop filter 114 to a value corresponding to a value of reference clock signal REFCLK received prior to entering the holdover mode. Similarly, if monitor 324 detects the input clock signal CLKIN has a gross failure, outer loop 204 freezes loop filter 124 such that output clock signal CLKOUT no longer tracks changes to input clock signal CLKIN, and selects a held output of the loop filter 124, or a value based on a stored output of loop filter 124, to be provided to divider 118, thereby holding steady the frequency of output clock signal CLKOUT. For example, monitor 324 holds the output of loop filter 124 to a value corresponding to a value of input clock signal CLKIN received prior to entering the holdover mode of outer loop 204. In at least one embodiment of clock product 104, during that holdover mode, the feedback divider ratio provided by the outer loop to divider 118 is based on past divider values (e.g., is an average of past divider values). When the divide ratio is frozen, the output frequency of CLKOUT varies only based on frequency variation of reference clock signal REFCLK.

Referring to FIG. 5, in at least one embodiment, clock buffer 104 uses collected statistics to generate one or more indicators that controller 102 uses according to predetermined user preferences (e.g., generate a status signal, switch source of reference clock signal, configure a phase-locked loop to operate open loop, reconfigure clock product 100, turn off output clocks). For example, controller 102 selectively enables select circuit 606 to switch a primary and secondary reference clock signal provided to clock buffer 104 according to the statistics and the target application, which may be selected using predetermined mode information in a storage element or provided from integrated circuit terminals. In addition, controller 102 may selectively provide power to only two crystal oscillators at a time to effectively combat effects of crystal aging.

For example, when clock product 100 switches the reference clock signal to the inner loop of the phase-locked loop from a primary reference clock signal to a secondary reference clock signal, controller 102 powers down the failing crystal generating the primary reference clock signal and powers up an unused crystal, and configures select circuit 606 to select the secondary reference clock signal to be the primary reference clock signal. Controller 102 and select circuit 606 configure the unused crystal as the secondary reference clock signal, which is available if the primary reference clock signal fails (e.g., in response to a failure or aging of the associated crystal). In response to degradation of each crystal due to aging, controller 102 generates control signal SEL3 that configures enable circuit 608 to selectively couple power supply 610 to a next available unused crystal, selectively disables an aged crystal currently providing the primary reference clock signal, and updates the primary and secondary reference clock signals until no unused crystals remain. As long as an unused crystal remains, controller 102 resets indicator INTRB each time an unused crystal is powered up. When no unused crystals remain, indicator INTRB indicates that a next failure of the reference clock signal will require open loop operation of the phase-locked loop or disabling of output clock signals CLKOUT[0:N]. In at least one embodiment, the next failure of the reference clock signal causes controller 102 to shut down the output clock signals. In some applications, an unreliable clock is preferable to no output clock signal and the clock buffer 104 continues to generate clock outputs in response to detecting a failure when no reliable reference clock signal remains. In other applications, controller 102 disables the output clock signals in response to such failures.

Figure 6:
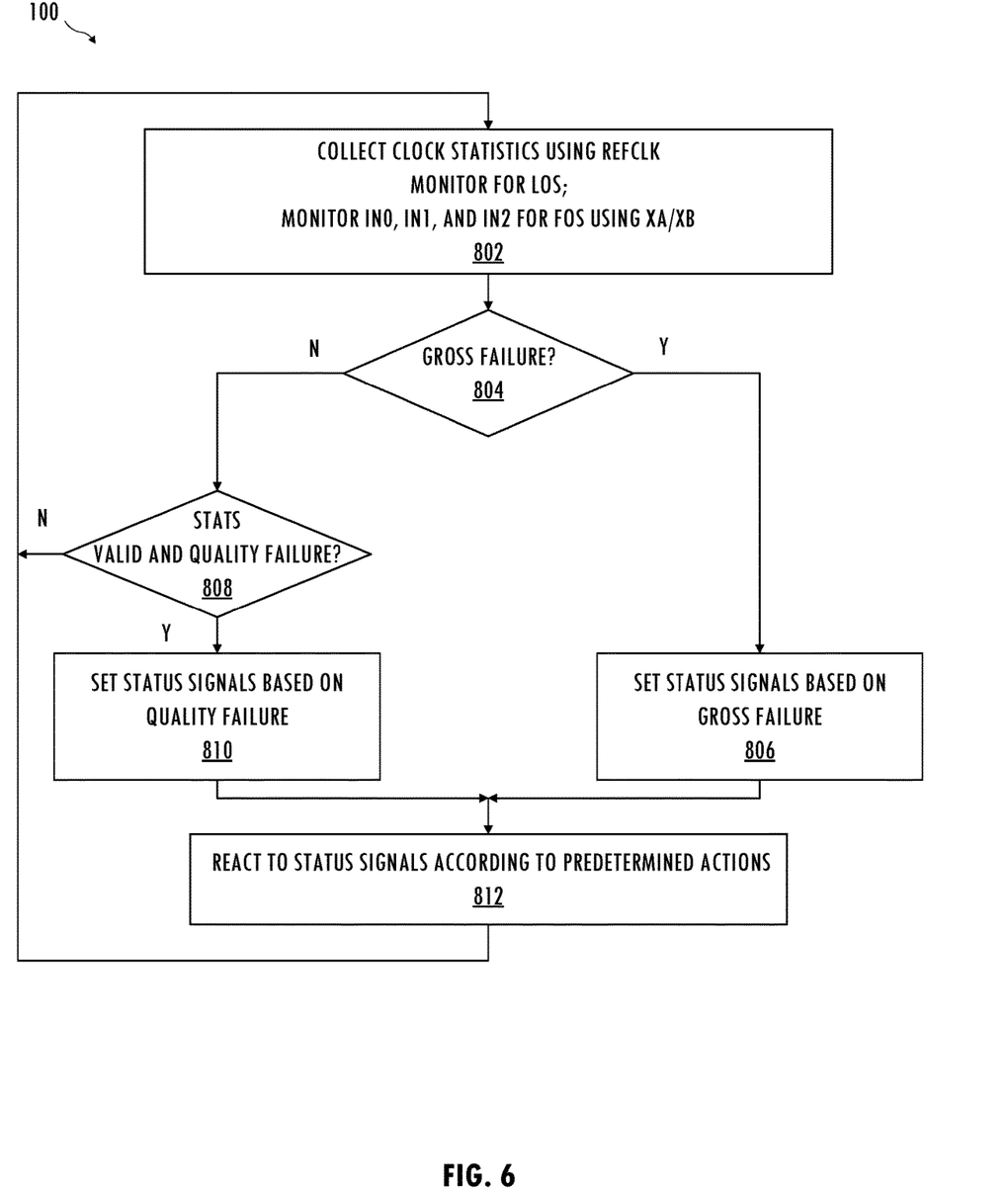
FIG. 6 illustrates information and control flows for the clock product of FIG. 5 consistent with at least one embodiment of the invention.

Referring to FIGS. 5 and 6, in an embodiment, clock product 100 is implemented using software executing on controller 102 (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium. In at least one embodiment, clock product 100 collects clock statistics using reference clock signal REFCLK. Meanwhile, clock buffer 104 monitors input clock signals IN[0:2] using reference clock signal REFCLK to detect gross failure of reference clock signal REFCLK (e.g., loss of signal or frequency offset) (802). If clock buffer 104 detects a gross failure of reference clock signal REFCLK (804), then clock buffer 104 sets status signals accordingly (806) and controller 102 handles the status signals according to predetermined actions (812). If clock buffer 104 does not detect any gross failure of the reference clock signal (804) and clock product 100 determines that the collected statistics are valid and detects a quality failure (808), then clock product 100 sets status signals based on the quality failure (810) and controller 102 handles the status signals according to predetermined actions (812). If clock buffer 104 does not detect any gross failure of the reference clock signal (804) and clock product 100 determines that the collected statistics are not yet valid or the statistics are valid but does not detect any quality failure (808), then clock product 100 continues to collect statistics and monitor for gross failures of reference clock signal REFCLK (802).

Thus, techniques for managing failures of a reference input clock signal in a clock buffer have been described. Use of the gross failure in combination with the quality failure substantially improves the frequency stability of the output signal (e.g., by two orders of magnitude) than using the gross failures alone without compromising response time to gross failures. The description of the invention set forth herein is illustrative and is not intended to limit the scope of the invention as set forth in the following claims. The terms "first," "second," "third," and so forth, as used in the claims, unless otherwise clear by context, is to distinguish between different items in the claims and does not otherwise indicate or imply any order in time, location, or quality. Variations and modifications of the embodiments disclosed herein may be made based on the description set forth herein, without departing from the scope of the invention as set forth in the following claims.

What is claimed is:

1. A method for generating a clock signal, the method comprising:

selecting a primary reference clock signal or a secondary reference clock signal as a reference clock signal for a phase-locked loop configured to generate an output clock signal; and generating an indication of whether a failure of the reference clock signal has occurred by monitoring the secondary reference clock signal and a plurality of additional clock signals using the reference clock signal, wherein the indication is generated based on whether a gross failure of the reference clock signal has occurred and if the gross failure has not occurred, further based on whether a quality failure of the reference clock signal has occurred, wherein the failure of the reference clock signal is a loss-of-frequency determined based on a first frequency offset of the secondary reference clock signal, a second frequency offset of a third clock signal of the plurality of additional clock signals, and a third frequency offset of a fourth clock signal of the plurality of additional clock signals.

2. A method for generating a clock signal, the method comprising:

selecting a primary reference clock signal or a secondary reference clock signal as a reference clock signal for a phase-locked loop configured to generate an output clock signal;

generating an indication of whether a failure of the reference clock signal has occurred by monitoring the secondary reference clock signal and a plurality of additional clock signals using the reference clock signal, the indication being generated based on whether a gross failure of the reference clock signal has occurred and if the gross failure has not occurred, further based on whether a quality failure of the reference clock signal has occurred; and in response to the failure of the reference clock signal having occurred:
  switching the reference clock signal from the primary reference clock signal to the secondary reference clock signal;
  powering down the primary reference clock signal, causing the secondary reference clock signal to be the primary reference clock signal; and
  powering up a redundant clock generator configured to generate an additional reference clock signal as the secondary reference clock signal.

3. The method, as recited in claim 1, wherein the reference clock signal is provided to an inner loop of the phase-locked loop, the method comprising:
  selecting an input clock signal of an outer loop of the phase-locked loop from the plurality of additional clock signals; and
  generating the output clock signal based on the reference clock signal and the input clock signal by providing a digital control signal from the outer loop to a feedback divider of the inner loop.

4. The method, as recited in claim 3, wherein the primary reference clock signal and the secondary reference clock signal are low-jitter reference clock signals and each of the plurality of additional clock signals are frequency-stable clock signals.

5. The method, as recited in claim 1, wherein the monitoring comprises:
  generating frequency metrics for the secondary reference clock signal and the plurality of additional clock signals, the frequency metrics being generated using the reference clock signal; and
  determining whether the quality failure has occurred based on the frequency metrics,
  wherein for each of the secondary reference clocks signal and the plurality of additional clock signals, the frequency metrics include a current average frequency count, a prior average frequency count, a standard deviation of prior average frequency counts, and a multiplicative constant corresponding to a number of samples used to determine the current average frequency count, prior average frequency count, and standard deviation.

6. The method, as recited in claim 1, further comprising:
generating a user indicator indicative of whether the failure of the reference clock signal has occurred.

7. The method, as recited in claim 1, further comprising:
switching the reference clock signal from the primary reference clock signal to the secondary reference clock signal in response to the failure of the reference clock signal having occurred and the reference clock signal being the primary reference clock signal.

8. The method, as recited in claim 1, further comprising:
switching from the secondary reference clock signal to open loop operation of the phase-locked loop in response to the failure of the reference clock signal having occurred and the reference clock signal having previously failed.

9. The method, as recited in claim 2, wherein the failure of the reference clock signal is a loss-of-frequency determined based on a first frequency offset of the secondary reference clock signal, a second frequency offset of a third clock signal of the plurality of additional clock signals, and a third frequency offset of a fourth clock signal of the plurality of additional clock signals.

10. The method, as recited in claim 1, further comprising:
disabling the output clock signal of the phase-locked loop in response to the failure of the reference clock signal having occurred and the reference clock signal having previously failed.

11. A clock product comprising:
  a phase-locked loop configured to generate an output clock signal based on a reference clock signal and an input clock signal, the reference clock signal being selected from a primary reference clock signal and a secondary reference clock signal; and
  a control circuit configured to generate an indication of whether a failure of the reference clock signal has occurred by monitoring the secondary reference clock signal and a plurality of additional clock signals using the reference clock signal,
  wherein the failure is determined based on whether a gross failure of the reference clock signal has occurred and if the gross failure has not occurred, further based on whether a quality failure of the reference clock signal has occurred,
  wherein the failure of the reference clock signal is a loss-of-frequency determined based on a first frequency offset of the secondary reference clock signal, a second frequency offset of a third clock signal of the plurality of additional clock signals, and a third frequency offset of a fourth clock signal of the plurality of additional clock signals.

12. The clock product, as recited in claim 11, further comprising:
  a first crystal configured to generate the primary reference clock signal; and
  a second crystal configured to generate the secondary reference clock signal,
  wherein the primary reference clock signal and the secondary reference clock signal are low-jitter reference clock signals and each of the plurality of additional clock signals are frequency-stable clock signals.

13. The clock product, as recited in claim 12, wherein the control circuit is further configured to power up an additional crystal configured to generate an additional reference clock signal and power down the first crystal, switching the primary reference clock signal to the second crystal and the secondary reference clock signal to the additional crystal in response to occurrence of the failure of the reference clock signal.

14. The clock product, as recited in claim 11, wherein the control circuit is further configured to power up an additional crystal configured to switch the reference clock signal from the primary reference clock signal to the secondary reference clock signal in response to occurrence of the failure of the reference clock signal and the reference clock signal being the primary reference clock signal.

15. The clock product, as recited in claim 11, wherein the control circuit is further configured to operate the phase-locked loop in an open loop configuration in response to occurrence of the failure of the reference clock signal and the reference clock signal being the secondary reference clock signal.

16. The clock product, as recited in claim 11, wherein the control circuit is further configured to enable a clock quality monitor in response to an absence of the gross failure of the reference clock signal.

17. The clock product, as recited in claim 11, wherein the control circuit is further configured to disable the output clock signal of the phase-locked loop in response to occurrence of the failure of the reference clock signal and the reference clock signal being the secondary reference clock signal.

18. The method, as recited in claim 2, wherein the monitoring comprises:
   generating frequency metrics for the secondary reference clock signal and the plurality of additional clock signals, the frequency metrics being generated using the reference clock signal; and
   determining whether the quality failure has occurred based on the frequency metrics,
   wherein for each of the secondary reference clocks signal and the plurality of additional clock signals, the frequency metrics include a current average frequency count, a prior average frequency count, a standard deviation of prior average frequency counts, and a multiplicative constant corresponding to a number of samples used to determine the current average frequency count, prior average frequency count, and standard deviation.

19. The method, as recited in claim 2, wherein the reference clock signal is provided to an inner loop of the phase-locked loop, the method comprising:
   selecting an input clock signal of an outer loop of the phase-locked loop from the plurality of additional clock signals; and
   generating the output clock signal based on the reference clock signal and the input clock signal by providing a digital control signal from the outer loop to a feedback divider of the inner loop.

20. The clock product, as recited in claim 11,
   wherein the control circuit is further configured to generate frequency metrics for the secondary reference clock signal and the plurality of additional clock signals, the frequency metrics being generated using the reference clock signal and further configured to determine whether the quality failure has occurred based on the frequency metrics,
   wherein for each of the secondary reference clocks signal and the plurality of additional clock signals, the frequency metrics include a current average frequency count, a prior average frequency count, a standard deviation of prior average frequency counts, and a multiplicative constant corresponding to a number of samples used to determine the current average frequency count, prior average frequency count, and standard deviation.

\* \* \* \* \*